United States Patent [19]
Boiucaner

[11] Patent Number: 5,142,152
[45] Date of Patent: Aug. 25, 1992

[54] SLIDING DOOR SENSOR
[75] Inventor: Leon Boiucaner, Farmington, Conn.
[73] Assignee: The Stanley Works, New Britain, Conn.
[21] Appl. No.: 636,763
[22] Filed: Jan. 2, 1991
[51] Int. Cl.[5] .............................................. E05F 15/20
[52] U.S. Cl. .................................... 250/341; 250/221; 250/349; 49/25; 340/545
[58] Field of Search .................. 250/341, 349, 221; 49/25, 31; 340/545

[56] References Cited
U.S. PATENT DOCUMENTS

4,733,081 3/1988 Mizukami ............................ 250/341
4,823,010 4/1989 Kornbrekke et al. ................. 49/25
4,967,083 10/1990 Kornbrekke et al. ................. 49/25

Primary Examiner—Carolyn E. Fields
Assistant Examiner—Drew A. Dunn
Attorney, Agent, or Firm—Chilton, Alix & Van Kirk

[57] ABSTRACT

A sliding door sensor employs two arrays of IR emitters which are pulsed to provide an approach detection zone and a threshold detection zone. Radiation reflected from the detection zones is converted to signals which are processed in microprocessors. The sensor periodically automatically adjusts for changes in background. Both presence and motion detection is provided. The sensor also detects dark objects.

23 Claims, 9 Drawing Sheets

SLIDING DOOR SENSOR

BACKGROUND OF THE INVENTION

This invention relates generally to traffic responsive control systems for automatic sliding doors. More particularly, the present invention relates to sliding door sensors which sense traffic approaching the doorway and/or traffic present in the vicinity of the door threshold and produce signals for controlling the operation of automatic sliding doors so that the doors remain in an open position until the traffic clears the door threshold.

Conventional automatic sliding door systems are automatically operable in response to various sensor configurations for initiating an opening sequence or in response to commands from operation initiating devices such as a push plate, a card reader or a mat. For sliding door applications, three separate sensor units are commonly employed. Two approach sensors are positioned for coverage at each side of the sliding door, and a threshold or safety sensor covers the threshold area in which the moving door panels travel. The approach sensors are conventionally microwave field distortion devices or passive infra-red motion sensing devices. The threshold sensors are conventionally presence sensing devices such as infra-red through-beams.

In U.S. Pat. No. 4,823,010 assigned to the assignee of the present invention, a diffuse-reflective infra-red threshold sensor generates a detection zone that extends on both sides of the door threshold. The infra-red transmitters are pulsed in a time spaced sequence. The threshold sensor operation is coordinated with the operate or door opening signals from the approach motion sensors. A latch sets a relay for maintaining the doors in an open position when traffic is detected in the sensor detection zone. In a disclosed sensor, four infra-red transmitters and a photodiode are mounted in a module which is mounted generally above the threshold of the sliding door.

Installations which employ separate approach sensors and threshold or safety sensors are prone to a number of problems which may eventually result in improper sensor operation. Approach sensors which require replacement due to failure or uncompensatable drift may be replaced with a sensor model which does not have specifications compatible with the original equipment. In addition, the conventional multiple sensor configurations for automatic door systems present problematic installation requirements, require a relatively sophisticated sensor coordination and frequently present a cluttered appearence at the door header.

There are a number of general constraints that are applicable to all sensor systems which employ infra-red (IR) detection. For example, it is desirable to adjust a threshold presence sensor as frequently as possible for the existing background to compensate for changes in the level of reflected light from the floor and the position of fixed objects in the vicinity of the door. It is also desirable to update the background compensation periodically and to compensate for changes in the general environment of the sensor. For certain highly reflective environments, "dark" targets traversing the doorway such as shopping carts or individuals wearing dark colored clothing may actually reduce, as opposed to increase, the amount of reflected radiation which impinges the sensor. The detection of both bright and dark targets is especially desirable in the threshold zone. Both presence and directional motion detection are advantageous for approach zone detection functions. Detection of directional motion allows for signal processing which enhances the possibility of achieving a minimum hold open time for the door while also satisfying safety, convenience and reliability requirements, thereby resulting in significant energy savings.

SUMMARY OF THE INVENTION

Briefly stated, the invention in a preferred form is a sliding door sensor which incorporates into a single unit both approach and threshold sensing functions and employs micro-processor based logic to generate signals for operating an automatic sliding door system in response to IR sensor detection.

The door sensor comprises a housing which mounts two arrays of IR emitters which respectively define an approach detection zone and a threshold detection zone. IR detectors are disposed in the housing for detecting radiation from the approach zone and the threshold zone. The signals from the detectors are converted into first and second pulse trains having a frequency which is proportional to the detected radiation from the zones. A programmable microprocessor is responsive to the first pulse train for generating a first output signal indicative of the detection of the target in the approach zone. The second programmable microprocessor is responsive to the second pulse train and generates a second output signal indicative of the identification of a target in the threshold zone. An output which may be in the form of a relay is responsive to the first and second output signals for producing an operator signal for operating an automatic door system.

The microprocessors further establish a reference count and compile a detector count indicative of detected radiation. The detector count is compared with the reference count for identifying a target. The microprocessors compensate for instrument drift. The initial reference count, which is indicative of the background radiation in the detection zone, is automatically established. The reference count is periodically adjusted to compensate for changes in the background radiation. The background change compensation involves equating the reference count to the detector count in a sequence of steps.

The threshold microprocessor is adapted for identifying a target, which may be either a bright object or a dark object, by determining whether the detector count is either greater than the reference count or less than the reference count by a pre-established sensitivity count value. A sliding door traverses the threshold detection zone. The microprocessor is adapted to account for the moving door panel. The approach microprocessor includes motion detection means for detecting the motion of a target in the detection zone.

Each of the microprocessors may be programmed to automatically establish a reference value which corresponds to the background radiation in the corresponding detection zone as well as for automatically periodically adjusting the reference to compensate for changes in the background radiation. In a preferred embodiment, the approach zone microprocessor detects both the presence of the target and the directional motion of the target in the approach zone, and the threshold microprocessor is adapted to detect either a dark or bright target in the threshold zone. The reference count is periodically updated by equating the count value to the reference value in a series of converging incremental adjustments.

An object of the invention is to provide a new and improved sensor for an automatic sliding door system.

Another object of the invention is to provide a new and improved sliding door sensor which incorporates both approach and threshold safety sensing into a single sensor unit.

A further object of the invention is to provide a new and improved sliding door sensor incorporating improved processing capabilities for background and environmental adjustments and enhanced detection.

A further object of the invention is to provide a new and improved sliding door sensor which is capable of efficiently detecting both bright and dark targets and employs microprocessor based technology to provide reliable output signals for an automatic door operator.

A yet further object of the invention is to provide a new and improved sliding door sensor which has an efficient construction and is relatively easy to install in the field.

Other objects and advantages of the invention will become apparent from the specification and the drawings.

DETAILED DESCRIPTION OF THE PREFERRED EMBODIMENT

Figure 1:
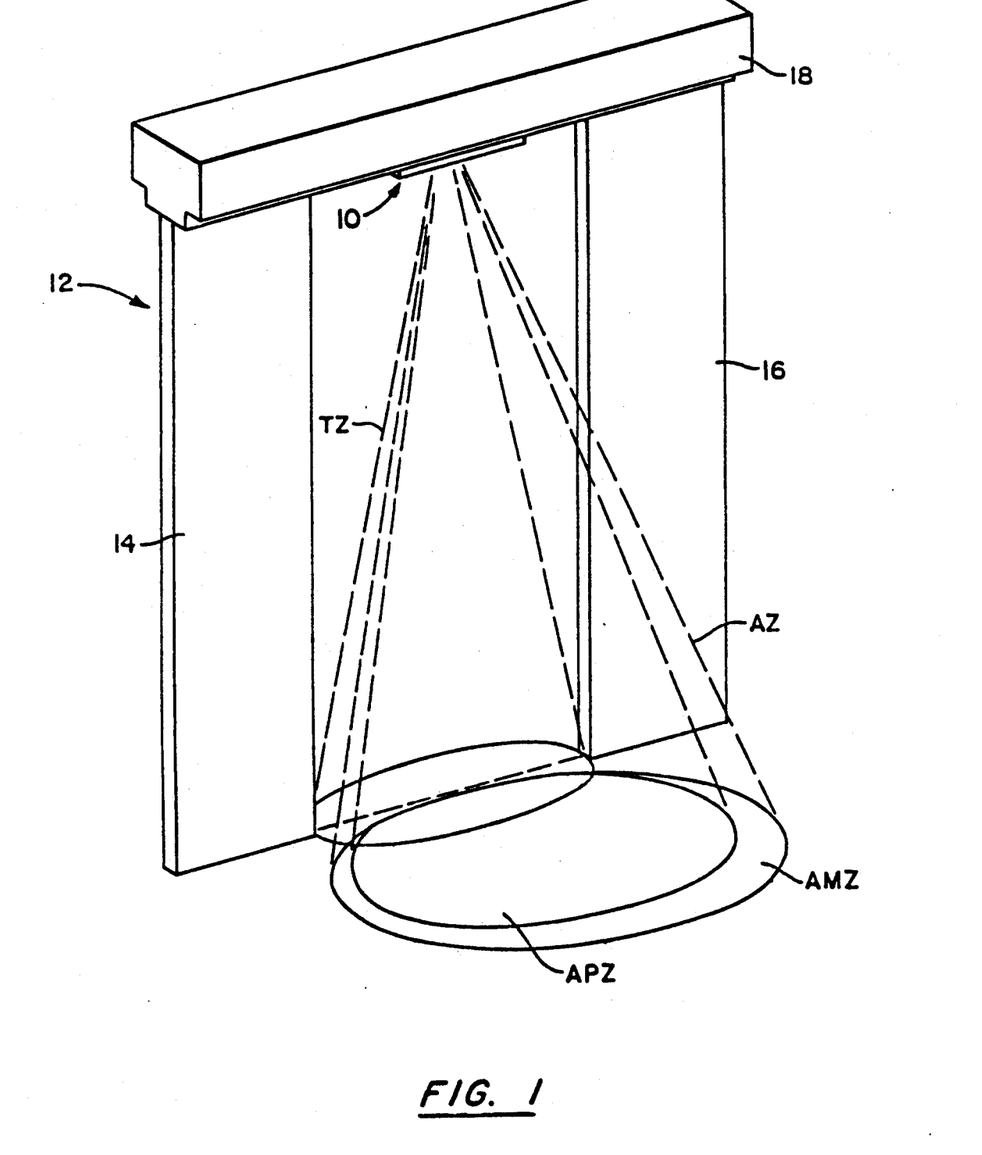
FIG. 1 is a frontal perspective view of a sliding door sensor in accordance with the present invention, said sensor illustrated in conjunction with a sliding door system, and the detection zones of the sensor illustrated schematically.

With reference to the drawings wherein like numerals represent like parts throughout the figures, a sliding door sensor designated generally by the numeral 10 is illustrated in conjunction with an automatic sliding door system designated by the numeral 12. The automatic sliding door system includes a pair of moving panels 14 and 16 which slide along a track (not illustrated) under the control of an automatic door operator mounted in the door header 18. The automatic operator (not illustrated) may be any of numerous forms which automatically control the operation of the sliding doors. A preferred automatic operator is the operator system disclosed in U.S. Pat. No. 4,563,625 assigned to the assignee of the present invention.

With reference to FIG. 1, the sliding door sensor 10 is an integrated sensor which illuminates both an approach zone (AZ) and an adjacent threshold zone (TZ) with pulsed infra-red radiation. The approach zone AZ may encompass a presence zone APZ and a motion zone AMZ at the outer forward fringe of the approach presence zone. Forward portions of the threshold zone TZ intersect rear portions of the approach zone AZ. The radiation which is reflected back to the receiver of the sensor is quantified and compaired to a pre-determined reference level. The reference level is updated and adjusted during the sensing operation. The output signal from the sensor 10 is derived from a microprocessor based logic process which will be detailed below.

Figure 2:
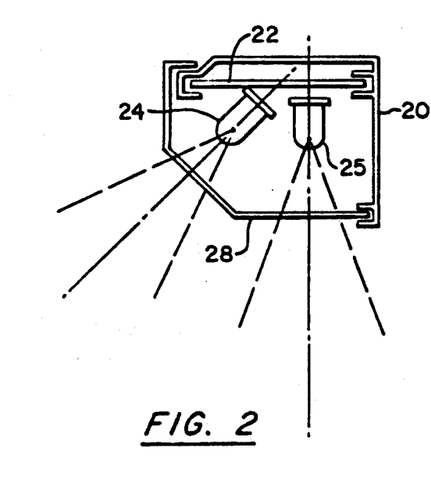
FIG. 2 is a cross-sectional view, partly in diagrammatic form with portions removed, illustrating the infra-red transmitter configuration for the sliding door sensor of FIG. 1.
Figure 3:
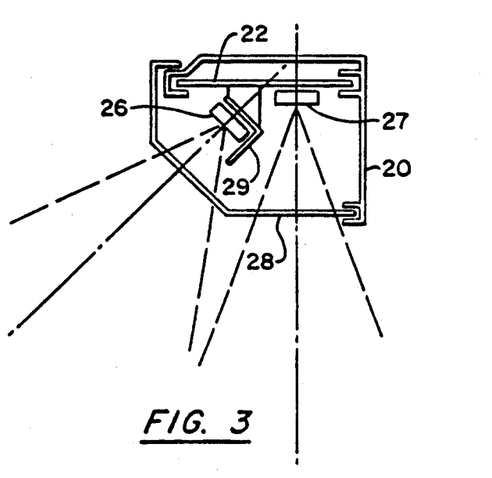
FIG. 3 is a cross-sectional view, partly in diagrammatic form with portions removed, illustrating the detector configuration for the sliding door sensor of FIG. 1.
Figure 4:
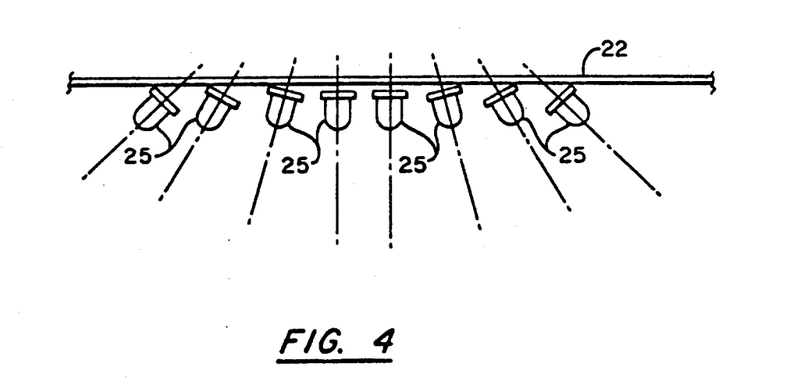
FIG. 4 is a fragmentary interior frontal view, partly in diagrammatic and schematic form, of an infra-red transmitter array for the sliding door sensor of FIG. 1.

The sliding door sensor 10 includes an elongated housing 20 which mounts at the frontal underside of the door header 18 above the door threshold. The housing 20 houses the IR transmitters, the IR receivers and the electronic circuitry for the sensor. With reference to FIGS. 2–4, circuit board 22 located in the housing mounts two arrays of IR emitters 24 and 25, respectively, and a pair of IR receivers 26 and 27. Receivers 26 and 27 are preferably PIN diodes. A lens cover 28 encloses the emitters and the receivers.

Eight IR emitters 24 are mounted to the circuit board 22 in a linear arrangement at fixed pre-established directional orientations for emitting pulsed IR radiation to define, in connection with the processing circuitry, the approach zone AZ. The reflected radiation from the approach zone AZ is received by the IR receiver 26. The second transmitter array comprises eight IR emitters 25 which extend downwardly in a generally vertical plane and are angularly oriented in the plane in fashion similar to that of the emitters 24. Emitters 25 emit pulsed IR radiation to define the threshold zone TZ which floods the threshold vicinity and extends at opposing sides of the door threshold. Radiation reflected from the TZ zone is received by the IR receiver 27. An optical barrier 29 is interposed between the receivers 26 and 27 to prevent interference between the AZ and TZ detection zones. A second optical barrier (not illustrated) is interposed between the emitter and receiver sections to avoid direct transmission of IR light to the receivers.

The IR emitters 24 and 25 have a half angle power of approximately 40°. The approach zone emitters 24 are oriented on axes which are approximately 45° to the corresponding axes (vertical) of threshold zone emitters 25 as illustrated in FIG. 2. The IR receivers 26 and 27 are also oriented in a corresponding 45° relationship as illustrated in FIG. 4. The axes of the emitters of each of the arrays are also defined by angularly orienting the emitters at approximately 15° increments from the medial vertical emitter pair as illustrated in FIG. 4.

The electronic circuitry associated with each of the approach and threshold detection zones is similar in construction. The processing for the approach zone is undertaken independently from that of the threshold zone. The processing for the approach zone and the threshold zone is coordinated by a common clock and intercommunication between the threshold and approach zone processing. A common output derived from the approach and threshold zone processing connects the sensor 10 with the door operator.

Figure 5:
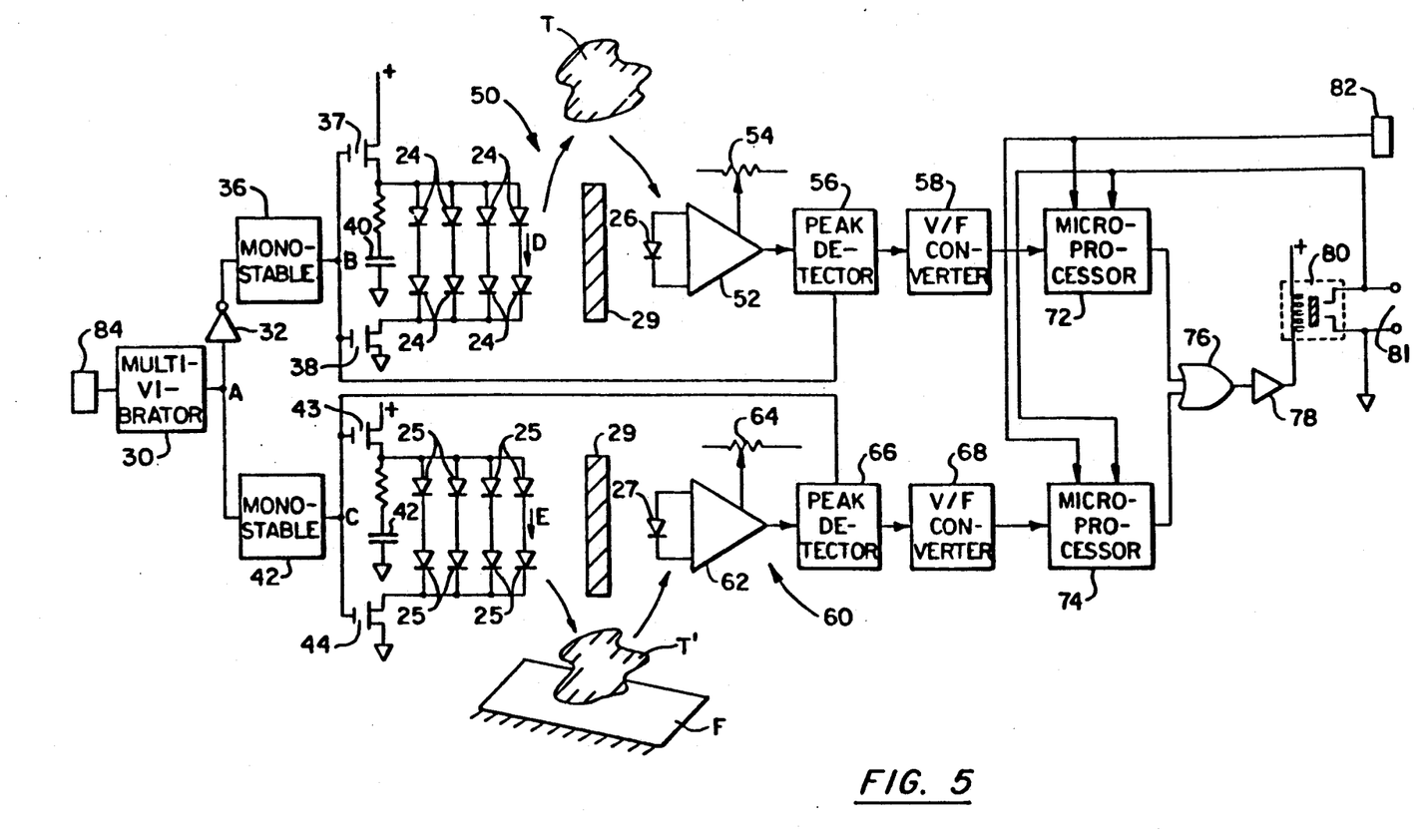
FIG. 5 is a schematic block diagram for the sliding door sensor of FIG. 1.

With reference to FIG. 5, clock pulses for the entire sensor circuitry are generated by a multivibrator 30. The multivibrator 30 generates a square wave clock pulse train at 2.5 khz. The circuitry 50 dedicated to the approach zone AZ (located in the upper portion of the FIG. 5 diagram), includes a monostable 36. The monostable 36 shapes control pulses to a relatively short 10 microsecond pulse duration. The approach array of IR emitters 24 is pulsed by discharging a capacitor 40 through a power transistor 38. The circuitry 60 dedicated to the threshold zone TZ (located in the lower portion of the FIG. 5 diagram) also includes a monostable 40. The array of IR emitters 25 for the threshold zone is pulsed by discharging a second capacitor 42 through a second driver transistor 44.

Figure 6:
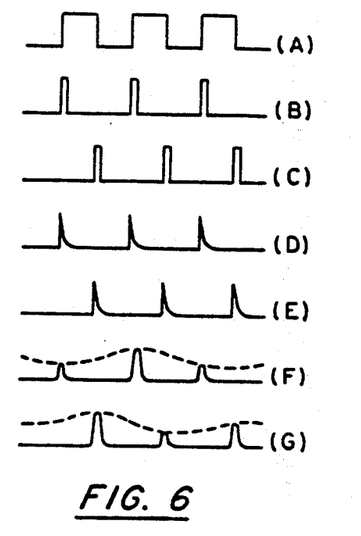
FIG. 6 is a graphical representation of various waveforms for the schematic block diagram of FIG. 5.

The inverter 32 functions to separate in time the operation of circuitry associated with the approach zone and the threshold zone by triggering the operation of the monostables 36 and 40 from opposite edges of the clock pulses from the multivibrator 30. The relationship between the square clock wave at junction A and the shaped clock pulses at junctions B and C is illustrated in FIG. 6 at (A), (B) and (C), respectively. The corresponding pulsed waveform for current in the approach IR emitters 24 and the threshold IR emitters 25 is respectively illustrated in FIG. 6 at (D) and (E). The transistors 37 and 43 recharge the capacitors 40 and 42, respectively, readying them for the next discharge cycle.

Reflected radiation from a target T in the approach zone AZ is received by the PIN diode 26 and amplified by a high gain pre-amplifier 52. The pre-amplifier 52 is adjusted by a gain adjusting trim potentiometer 54. The output from amplifier 52 is transmitted to a peak detector 56. The peak detector 56 is gated by the pulse train which fires the approach emitters so that the input pulses are received and processd synchronously with the IR emitters 24. The output of peak detector 56 is a DC voltage that corresponds to the level of IR radiation received by the PIN diode 25. The relationship betweent the input (solid line) and the output (dash line) signals of peak detector 56 is illustrated in FIG. 6 at (F). The analog voltage signal from peak detector 56 is applied to a voltage/frequency (V/F) converter 58 wherein the input signal is converted to a pulse train having a frequency proportional to the input voltage.

Likewise, IR radiation reflected from a target T' and/or the floor F in the threshold zone TZ is received by PIN diode 27 and amplified by a high gain pre-amplifier 62. The pre-amplifier 62 is adjusted by a gain adjusting trim potentiometer 64. The output from amplifier 62 is transmitted to peak detector 66. The peak detector 66 is gated by the pulse train which fires the threshold emitters so that the input pulses are received and processed synchronously with the IR emitters 25. The output of peak detector 66 is a DC voltage that corresponds to the level of IR radiation received by the PIN diode 27. The relationship between the input (solid line) and the output (dash line) signals of peak detector 66 is illustrated in FIG. 6 at (G). The analog signal from the peak detector 66 is applied to a V/F converter 68 for conversion to a pulse train having a frequency proportional to the input voltage.

The pulse trains from V/F converters 58 and 68 are applied to internal counters/timers of the respective microprocessors 72 and 74. The microprocessors 72 and 74 are substantially identical devices which are specifically programmed for either approach or threshold zone processing. Microprocessors 72 and 74 may each be a 8051 type processor. The number of input pulses received by the microprocessors within a pre-established time interval, such as, for example, 100 milliseconds, is counted. A numerical value, which is proportional to the integral of the level of received radiation over the corresponding time interval, is derived and stored in the memory of each of the microprocessors. The periodically updated data is employed in the logic processing of the microprocessors 72 and 74, as will be detailed below.

The output signals from microprocessors 72 and 74 are applied to an OR gate 76 which provides an output to relay driver 78. The signal from driver 78 is applied to the output relay 80 for controlling the output contacts 81 which provide the sensor output signals. In addition, a feedback signal from the contacts 81 is applied to the input pins of microprocessors 72 and 74 so that the status of the door operator opening signal at the contacts 81 may be incorporated into the logic processing of the microprocessors. The door operator opening signal at the output contacts 81 is applied to the door operator (not illustrated) for operating the sliding door system.

A synchronizing terminal 82 may be employed to provide clock synchronization in multiple sensing installations to thereby eliminate interunit interference among multiple sensors. A one-way traffic operation terminal 84 may also be employed to selectively send to the microprocessors an input signal which implements one-way traffic operation through the doors. Various other options (not illustrated) may also be provided to allow for selection of various sensor parameters by the user.

Figure 7:
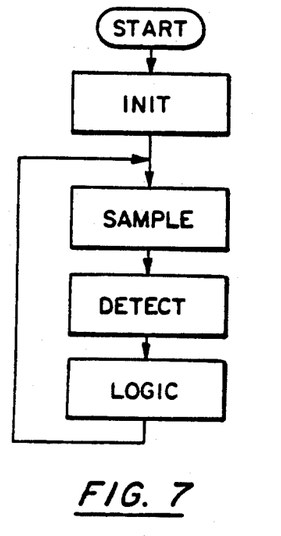
FIG. 7 is a flow chart illustrating the general processing for the program modules of the sliding door sensor of FIG. 1.

The microprocessors 72 and 74 each employ similar programs and formats which are adapted for processing for either the approach zone AZ or the threshold zone TZ. With reference to FIG. 7, the general program for each of the microprocessors comprises an INIT program module and SAMPLE, DETECT and LOGIC program modules which connect in a loop. The SAMPLE module is dedicated to interpreting the input information from the V/F converters 58 and 68. Internal clocks of the microprocessors allow internal counters to count the pulses in the pulse train for the constant time interval (100 msec.). The counting process is itermittantly terminated and the accumulated count is transferred to the memory of the microprocessor. The accumulated count (C) is thus proportional to the average level of radiation which impinges the corresponding PIN diodes 26 or 27.

Figure 8:
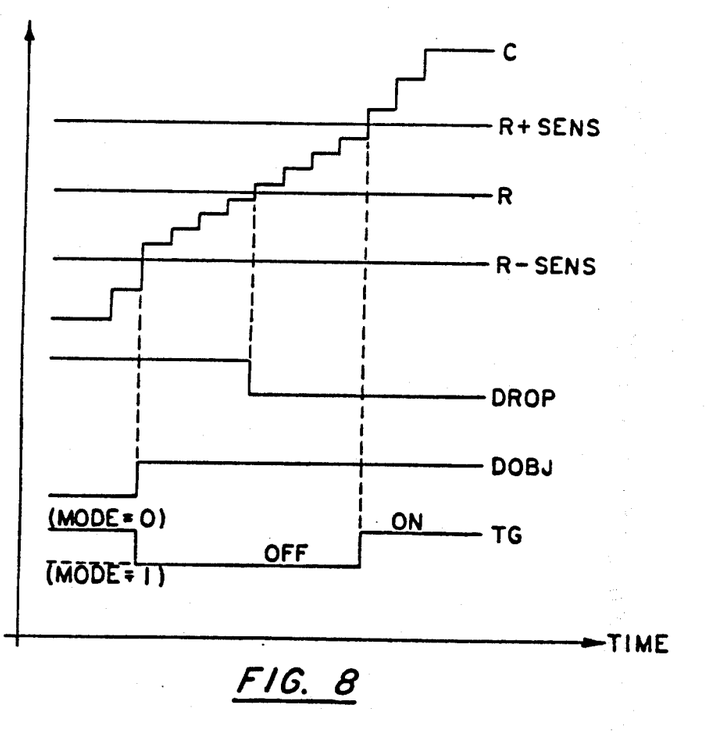
FIG. 8 is a graphical representation illustrating the detection module processing for the sliding door sensor of FIG. 1.

With reference to FIG. 8, the DETECT module compares the current count C to a pre-determined reference count (R) which represents the level of background illumination. If the absolute value of the difference C-R exceeds a preset sensitivity value, then a flag TG is set to indicate that a target has been detected. A dark object flag (DOBJ) is produced if the C-R difference exceeds the SENS value in the negative direction. The DOBJ flag indicates that a dark object has been detected, i.e., the target reflects less radiation than the ambient background. If the count C decreases to a value smaller than the reference value R, i.e., C-R is negative, then a DROP flag is produced.

For certain conditions or installations, the detection of dark objects may not be required. A MODE flag is employed for this latter mode of operation. The TG flag will be produced for the C-R difference exceeding the SENS value in a positive direction only. The relationships between the C, R and SENS values and the corresponding TG, DROP and DOBJ flags are illustrated in FIG. 8.

The data obtained by the DETECT module is processed by the LOGIC module to derive output signals which account for various constraints such as accounting for the moving door panels during the sensing operation. In addition, the LOGIC module implements procedures which compensate the long term drift in the circuitry. The drift may be either internal to the circuits or induced by environmental changes. The time required for completion of a program loop cycle is principally determined by the execution time of the SAMPLE module and may therefore be approximately 100 milliseconds. The loop time (FIG. 7) is also employed in the timing routines so that all of the timers which are required in the programs of the microprocessors 72 and 74 are essentially cycle counters.

Figure 13:
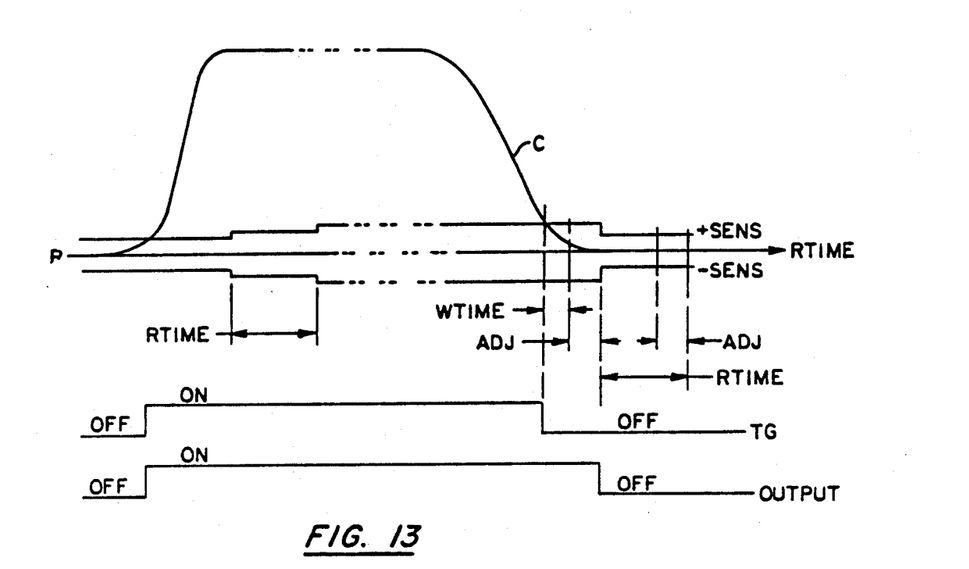
FIG. 13 is a graphical representation relative to a time axis illustrating the presence mode logic signals employed in a threshold sensing routine for the sliding door sensor of FIG. 1.
Figure 14:
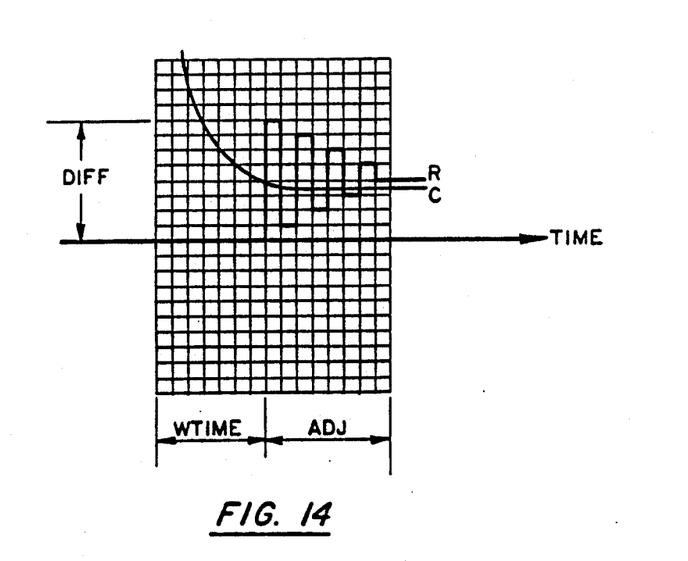
FIG. 14 is a graphical representation illustrating the process for correction of the reference values for the sliding door sensor of FIG. 1.
Figure 15:
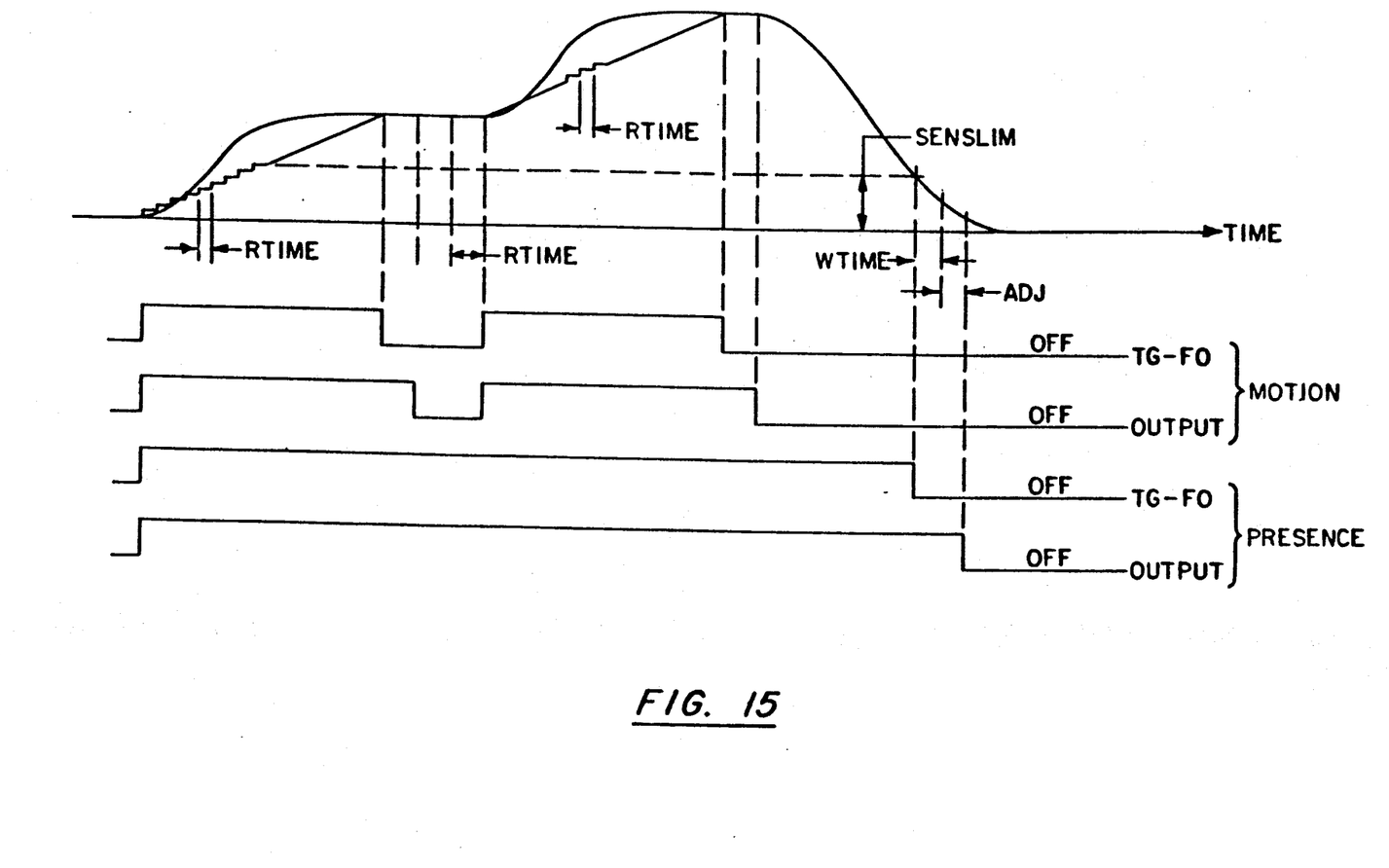
FIG. 15 is a graphical representation relative to a time axis illustrating the presence and motion mode logic signals employed in an approach sensing routine for the sliding door sensor of FIG. 1.

The programs of the LOGIC module are illustrated by the flowcharts in FIGS. 9-12. The variation over time of the variables processed in the microprocessors 72 and 74 are illustrated by FIGS. 13, 14 and 15. The two microprocessors 72 and 74 essentially contain the same programs, with branches for operation in either threshold or approach sensing modes. The selection of the mode implemented by the OPMODE signal (represented by the microprocessor identifying its location in the sensor by the status of a dedicated input defined by a "0" for approach and a "1" for threshold).

Figure 9:
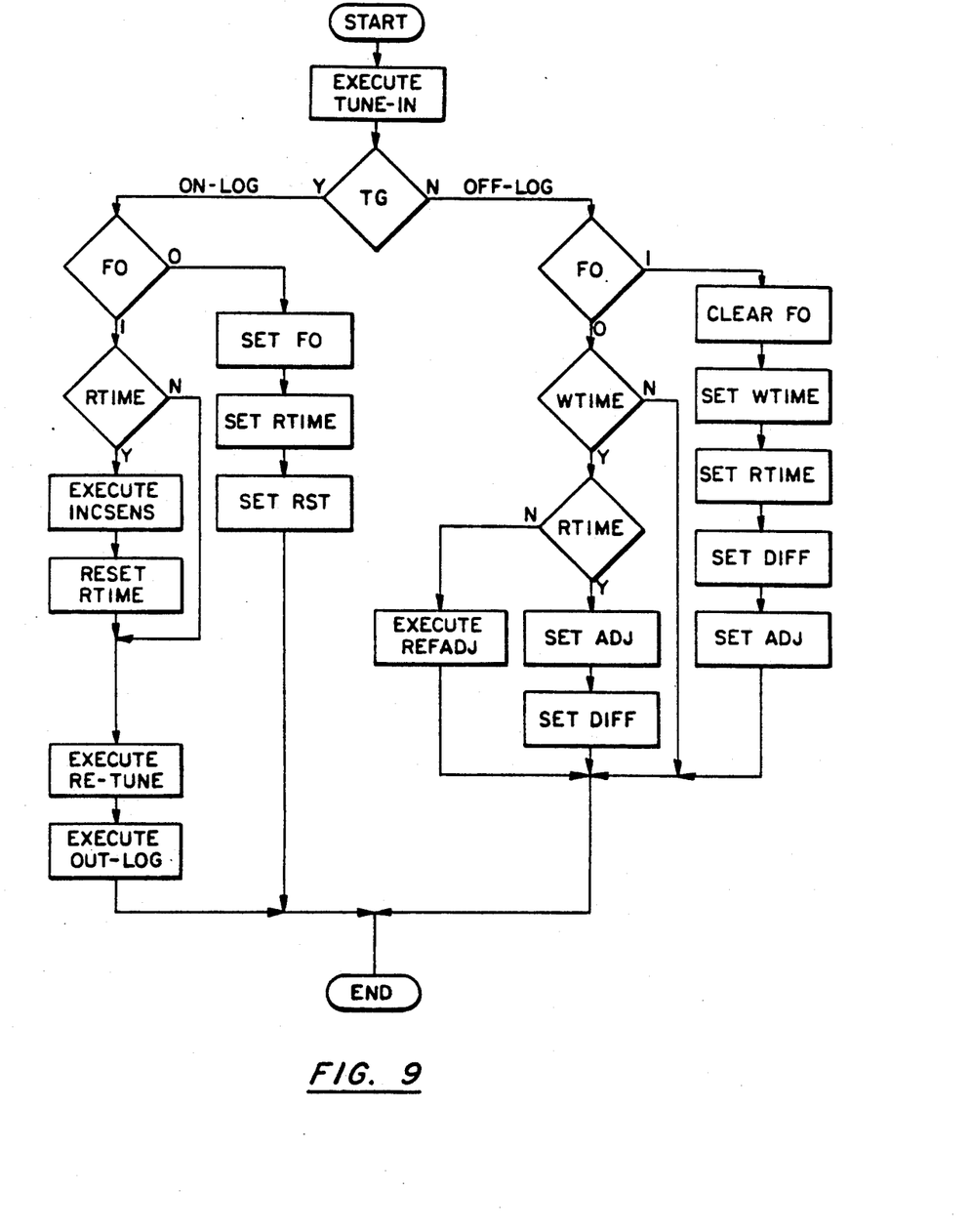
FIG. 9 is a flow chart illustrating the processing logic of the sliding door sensor of FIG. 1.

With reference to FIG. 9, the LOGIC program initially executes a TUNE-IN subroutine which establishes the correct value of the reference count R when the sensor 10 starts to operate. The TUNE-IN subroutine is structured so that once the correct reference is established, it will not interfere in any way with the succeeding execution of the program. The status of the target flag TG as established by the DETECT module routes the program to either an ON-LOG branch (target detected) or an OFF-LOG branch (no target detected) in accordance with whether or not a target has been detected.

An auxiliary flag F0 is employed to detect the first cycle of a transition from the OFF-LOG to the ON-LOG modes. The identification of the first cycle is employed to set the repeat timers (RTIME) and the reset timer (RST). Referring to the ON-LOG branch, for the second and succeeding cycles, the program runs through a self resetting repeat RTIME timer and periodically executes an INCSENS subroutine. The INCSENS subroutine functions to slightly increase the sensitivity value SENS which is employed in the DETECT module.

The SENS value may be increased until a preset limit (SENSLIM) is reached. Variation in the SENS value is limited to the SENSLIM value so that there is no significant decrease in the overall detection capabilities of the sensor. The increase in the SENS value allows for accumulated drift when the ON-LOG subroutine operates for extended periods of time during presence detection. The extended operation may occur with the door open when slow moving or stationary targets are detected, or with the door closed when the door moving panels are essentially being detected. The longer the ON-LOG subroutine operates, the greater the drift allowance, up to a limit SENSLIM value.

Figure 10:
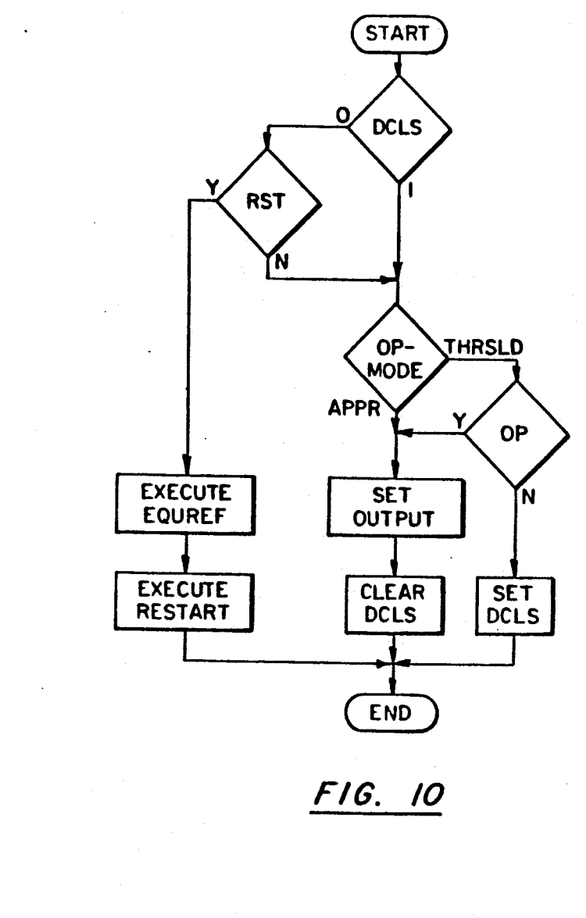
FIG. 10 is a flow chart illustrating the retuning processing for the sliding door sensor of FIG. 1.

With additional reference to FIG. 10, the RE-TUNE subroutine records the time that the door has been held in an open mode (DCLS flag absent) and allows for the restarting of the sensor by incorporating a stationary target into the reference reading provided the target is present for longer than a preset time as defined by the setting of the RST time. The reset RST time is typically selected at 60 or 300 sec. in the threshold mode and for as short as 24 sec. for the approach mode. The EQU-REF subroutine equates the reference count R with the running count C to force the program to the OFF-LOG mode at the next cycle via the DETECT module. The RESTART subroutine re-initializes the parameters used in the TUNE-IN subroutine.

The OUT-LOG subroutine controls the processing of the output signal. For approach detection the output signal (OUTPUT) is set and the door closed DCLS flag is cleared unconditionally. When implemented for threshold sensing, the OUTPUT signal is set only if the sensor output (OP) signal is present indicating that the door is either open or in the process of opening. The OP signal may result from threshold, approach or external detection. In the threshold detection mode when the OP signal is set to 0, the OUTPUT signal is not set although a target has been detected, because the detected target is a moving door panel which must be disregarded as a door opening initiating target in the processing logic. The DCLS flag is set to indicate that a closed door situation follows. The DCLS flag is also employed to route the program around the RST timer when the door is closed to that the sensor is not reset and retuned with a closed door.

The approach mode motion sensing or combined motion/presence sensing is obtained from essentially the same ON-LOG program by appropriately adjusting the setting of the RTIME timer and the INCSENS subroutine parameters. The shapes of the various signals relative to a time axis for both the motion and presence sensing processing modes is illustrated in FIG. 15. Detection for dark objects is ordinarily not obtained for the approach zone.

In the motion sensing mode, the RTIME value is set for a faster repetition rate of the INCSENS value (as fast as once each cycle), and the SENS value may be incrementally increased. In a relatively short time interval, an OFF state may be achieved, and thus the sensor detection output will be turned off for a stationary target. The time interval required to achieve an OFF state increases as the target approaches the door and the count C increases.

The motion/presense sensing combination may be achieved by limiting the amount of the increase of the SENS value from an initial value. Thus, motion detection is provided for small count C variations prior to attaining the pre-established SENSLIM value and presence detection is provided thereafter for the count C values exceeding the SENSLIM value. The SENSLIM value can be calculated so that the motion fringe zone AMZ of a pre-determined size surrounds a centrally position presence zone APZ. Consequently, the approach zone AZ sensing provides an enhanced safety factor by implementing a redundant presence approach zone and threshold zone overlap in regions close to the door and a motion approach zone for distances further away from the door. In addition, the motion/presence sensing tends to initiate the door closing faster in case of a nuisance trip.

The OFF-LOG routine (FIG. 9) commences with identification of the first cycle by use of the auxiliary flag F0. Various timers are set during the first cycle including a wait time (WTIME) timer, a repetition (RTIME) timer and a reference correction (ADJ) timer. In addition a difference (DIFF) value employed in the reference adjusting (REFADJ) subroutine is also set. A wait of approximately 0.7 seconds may typically be set in order that the decreasing count C stabilizes by the WTIME interval. The repetition RTIME timer then periodically reruns the REFADJ subroutine. The relationships for the presence logic mode between the RTIME, WTIME and ADJ times, and representive counts C and reference R are illustrated in FIG. 13.

Figure 11:
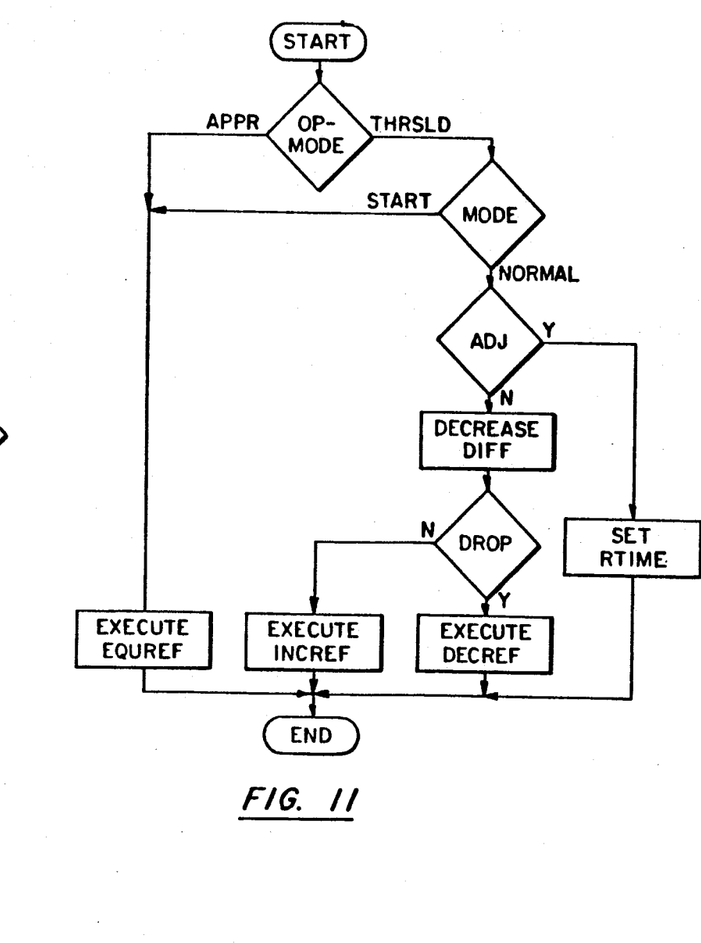
FIG. 11 is a flow chart illustrating the reference adjustment processing for the sliding door sensor of FIG. 1.

The REFADJ subroutine for adjusting the reference R is illustrated in FIGS. 11 and 14. When both bright and dark objects are being detected in the threshold sensing mode, the "OFF" state band is extremely narrow. Consequently, it is important that substantial changes not be made to the reference R which would likely result in nuisance tripping errors. The correction to the R value is accomplished by increasing or decreasing the R value in the direction that the count C signal evolved as identified by the DROP flag derived in the DETECT module. An INCREF subroutine increases the current R value and a DECREF subroutine decreases the current R value by a current difference (DIFF) value which is preset in a preceeding cycle. Accordingly, for each cycle the DIFF value is decreased by one count so that the R value approaches the C value in converging fashion. The foregoing reference R correction process is illustrated in FIG. 14. This procedure achieves an accurate correction for a relatively large deviation in a relatively short time. In addition, since the REFADJ subroutine is periodically repeated during the time that the door is in the open mode with no target in sight, the REFADJ subroutine will tend to compensate in time for environmental drift.

In normal operation with the door closing as soon as the detection zones are clear, the REFADJ subroutine is executed at least once, commencing with the start of the door closing sequence.

For approach motion sensing processing, a different procedure is employed for adjusting the reference R value. When only bright objects are desired to be detected as targets, such as may be desirable in approach sensing or during the starting TUNE-IN procedure, the EQUREF subroutine equalizes the reference R value to the current count C value. Since only a signal increase in the C value will generate an ON state, any decrease in signal will always generate an OFF state. Consequently, a target approaching the door will produce an increasing signal and an ON state will result. A target originally close to the door, which is departing, will not be detected by the directionally selective motion sensor.

Figure 12:
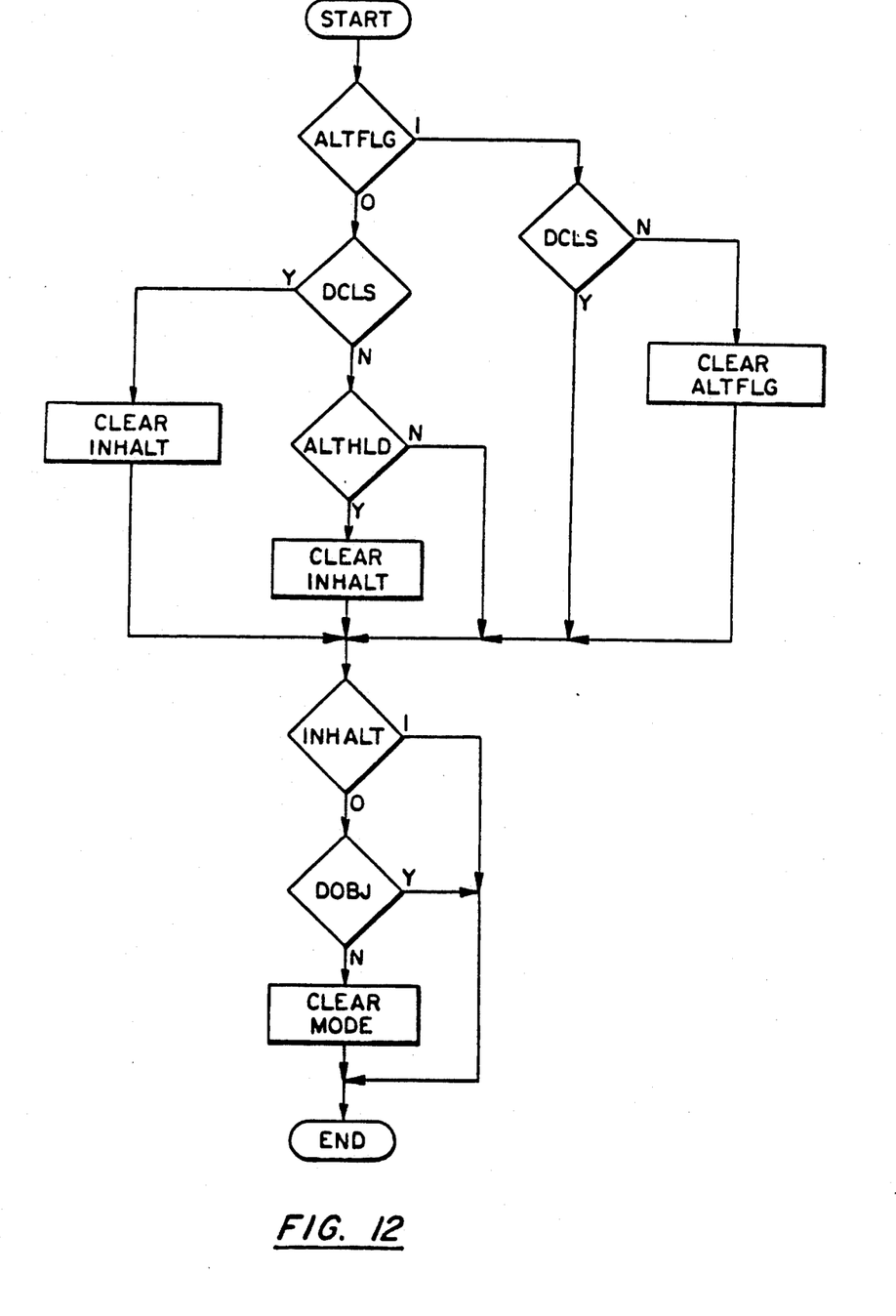
FIG. 12 is a flow chart illustrating the initial reference processing for the sliding door sensor of FIG. 1.

With reference to FIG. 12, the TUNE-IN subroutine functions to initially establish the correct reference R value when the sensor commences operation, e.g. when power is initially applied or during normal operation when the sensor must account for substantial changes in the environment or the background. The TUNE-IN routine is started either by applying the power to the sensor or as a result of a RESTART signal resulted from operation of ON-LOG routine; this may occur under a wide range of conditions, such as, for example, when the door is held open, the door is closed or traffic is traversing through the doorway. Parameters to be satisfied in order to obtain a valid reference reading have been selected as follows:

a. The door must first open to prove the system is operational.
b. The door must subsequently be able to close.
c. A means to repeat a failed attempt at reading the background must be operational.

With reference to FIG. 7, when power is initially applied to the sensor, an initialization (INIT) module is operated. The INIT module sets the output, e.g., generates a door open signal, for approximately 5 seconds. The INIT module also sets the ALTFLG, INHALT and MODE flags employed in the TUNE-IN subroutine. The RESTART signal produces the same action to the MODE, ALTFLG, INHALT and ALTHLD flags as the INIT module. If the MODE flag is set, then bright target detection only takes place. The OFF-LOG routine previously described employs in this case the EQUREF subroutine to equate the reference R value to the count C value. This procedure ensures that the TUNE-IN program will automatically search for the lowest count encountered during the search period to establish the initial R value. The low count search compensates for the condition wherein ongoing traffic is occuring while the reference R is initially established.

In practice, the vast majority of subjects traversing through the doorway are bright targets. Consequently, if one of the infrequently encountered dark targets is encountered during the TUNE-IN process, the initialization process may fail resulting in a reference that is too low and an improper "ON" state wherein the door is held in an open mode. In the later instance, the system will wait for a reset in the RE-TUNE procedure as previously detailed in connection with the ON-LOG procedure. To accelerate the TUNE-IN procedure, a short RST time is preset during the start-up phase.

With reference to FIG. 12, the initial ALTFLG status directs the programs to wait for the door to open. The "OFF" state of the DCLS flag, confirms the opening of the door. The programs subsequently waits for the door to close by the presence of the DCLS flag and then the INHALT flag is cleared. When the INHALT flag is removed, the MODE flag is cleared (except in the event a dark object is sensed as revealed by the status of the DOBJ flag), and the program reverts to the normal presence detection wherein both bright and dark objects are sensed. The R value, which is present in the memory, is maintained and employed in the program. As previously detailed, only small changes of the reference R value are possible.

It will be appreciated that the sliding door sensor 10 as described is an active infra-red sensor incorporated into a single unit to provide detection for an approach and an adjacent threshold safety zone while implementing means to avoid detecting the moving door panels. Presence, motion and combined motion/presence modes of operation are accomplished by programmed microprocessors. The sensor implements presence sensing for both bright and dark targets. In addition, automatic initialization, background reflectivity adjustments and continuous compensation for slow changes or drift in the environment are also provided. Compensation for substantial environmental changes is accomplished by automatic reset and retune functions of the microprocessor based programming.

While a preferred embodiment of the foregoing invention has been set forth for purposes of illustration, the foregoing description should not be deemed a limitation of the invention herein. Accordingly, various modifications, adaptations and alternatives may occur to one skilled in the art without departing from the spirit and the scope of the present invention.

What is claimed is:

1. A door sensor comprising:
   housing means;
   first emitter means disposed in said housing means comprising a first array of IR emitters defining a first detection zone;
   second emitter means disposed in said housing means comprising a second array of IR emitters defining a second detection zone;
   first detector means disposed in said housing means for detecting radiation from said first zone;
   second detector means disposed in said housing means for detecting radiation from said second zone;
   first converter means responsive to said first detector means for generating a first pulse train having a frequency proportional to the detected radiation;
   second converter means responsive to said second detector means for generating a second pulse train having a frequency proportional to the detected radiation;
   first microprocessor means responsive to said first pulse train for identifying a target in said first zone and generating a first output signal indicative thereof;
   second microprocessor means responsive to said second pulse train for identifying a target in said second zone and generating a second output signal indicative thereof, said second microprocessor means comprising identification means comprising reference means for establishing a reference value, detector count means for obtaining a count indicative of detected radiation, and comparison means for comparing said detector count to said reference value, and background adjustment means for incrementally adjusting said reference value by decreasing or increasing the reference value by a sequence of decreasing positive difference counts determined by a difference between a preceding count value and a preceding reference value so that said reference value incrementally converges toward said count value.

2. The door sensor of claim 1 wherein said comparison means employs a sensitivity value for identifying a target when the detector count differs from said reference count by an amount at least equal to the sensitivity value and further comprising sensitivity adjustment means for adjusting said sensitivity value.

3. The door sensor of claim 2 further comprising limit means for limiting the adjustment to said sensitivity value.

4. The door sensor of claim 1 wherein each said microprocessor means further comprises background reference means for automatically determining an initial reference count indicative of the background radiation in a detection zone.

5. The door sensor of claim 4 wherein said background adjustment means periodically adjusts said reference count to compensate for changes in said background radiation.

6. The door sensor of claim 5 wherein said background adjustment means comprises equalization means for equating said reference count to said detector count.

7. The door sensor of claim 4 wherein said background reference means further comprises means for preventing determining the initial reference count with a door in a closed position.

8. The door sensor of claim 2 wherein at least one said microprocessor means comprises target means for identifying a target in the event said detector count is either greater than said reference count or less than said reference count by a pre-established sensitivity value.

9. The door sensor of claim 1 wherein a door traverses in one said detection zone and the corresponding microprocessor means comprises door account means for disregarding the door as a target.

10. The door sensor of claim 1 wherein one said microprocessor means comprises motion detection means for detecting the motion of a target in a said detection zone.

11. A door sensor comprising:
    housing means;
    first emitter means disposed in said housing means comprising a first array of IR emitters defining an approach detection zone;
    second emitter means disposed in said housing means comprising a second array of IR emitters defining a threshold detection zone;
    first detector means disposed in said housing means for detecting radiation from said approach zone;
    second detector means disposed in said housing means for detecting radiation from said threshold zone;
    first converter means responsive to said first detector means for generating a first pulse train having a frequency proportional to the detected radiation;
    second converter means responsive to said second detector means for generating a second pulse train having a frequency proportional to the detected radiation;
    first microprocessor means responsive to said first pulse train for identifying a target in said approach zone and generating a first output signal indicative thereof;
    second microprocessor means responsive to said second pulse train for identifying a bright or a dark target in said threshold zone and generating a corresponding bright or dark signal, said second microprocessor means comprising identification means for identifying a target which causes radiation detected by said second detector means to have a detected count value which is either greater or less than a pre-established reference value by at least a pre-established positive sensitivity value and generating a second output signal indicative thereof; and output means responsive to said first and second signals for producing an operator signal.

12. The door sensor of claim 11 further comprising mode select means for selectively transforming said second microprocessor means into a mode wherein only bright targets are identified.

13. The door sensor of claim 11 further comprising sensitivity adjustment means for automatically adjusting said sensitivity value.

14. The door sensor of claim 13 wherein said sensitivity adjustment means is responsive to the time duration of said operator signal.

15. The door sensor of claim 14 further comprising limit means for limiting the adjustment to said sensitivity value.

16. The door sensor of claim 11 further comprising means for automatically initially establishing said reference value.

17. The door sensor of claim 11 wherein said first microprocessor means comprises means for direction motion detection of a target in said approach zone.

18. The door sensor of claim 16 further comprising background adjustment means for periodically adjusting said reference value to compensate for changes in background radiation in said threshold zone.

19. The door sensor of claim 18 wherein said background adjustment means further comprises equalizaton means for incrementally adjusting said reference value after a pre-established wait time by decreasing or increasing the reference value by a sequence of decreasing positive difference counts initially determined by a difference between an actual count value and a reference count value in accordance with a comparison relationship between the preceeding count value and the preceeding reference value.

20. A door sensor and door system comprising:
automatic sliding door means comprising at least one door traversable across a threshold;
housing means disposed generally above said threshold;
first emitter means disposed in said housing means comprising a first array of IR emitters defining an approach detection zone generally frontally spaced from said threshold;
second emitter means disposed in said housing means comprising a second array of IR emitters defining a threshold detecting zone intersecting said approach detection zone and extending at opposing sides of said threshold;
first detector means disposed in said housing means for detecting radiation from said approach zone;
second detector means disposed in said housing means for detecting radiation from said threshold zone;
first converter means responsive to said first detector means for generating a first pulse train having a frequency proportional to the detected radiation;
second converter means responsive to said second detector means for generating a second pulse train having a frequency proportional to the detected radiation;
first programmable microprocessor means responsive to said first pulse train for identifying a target in said approach zone by periodically counting pulses in said first pulse train, processing signals and generating a first output signal indicative thereof;
second programmable microprocessor means responsive to said second pulse train for identifying a target in said threshold zone by periodically counting pulses in said second pulse train, processing signals and generating a second output signal indicative thereof;
each said microprocessor means comprising reference means for automatically establishing a reference value corresponding to the background radiation in the corresponding detection zone and reference adjustment means for periodically adjusting the reference value to compensate for changes in the background radiation, one said microprocessor means comprising identification means comprising reference means for establishing a reference count, detector count means for determining a count indicative of detected radiation, comparison means for comparing said detector count to said reference count, and background adjustment means for incrementally adjusting said reference value by decreasing or increasing the reference value by a sequence of decreasing positive difference counts determined by a difference between a preceeding count value and a preceeding reference value so that said reference value incrementally converges toward said count value.

21. The door sensor and door system of claim 20 wherein said first microprocessor means comprises means for detecting the directional motion of a target in said approach zone and said second microprocessor means comprises object detection means for detecting a target which produces a detection count which is either greater than or less than said reference value by at least a pre-established positive sensitivity value.

22. The door sensor and door system of claim 21 further comprising sensitivity adjustment means responsive to the time duration of an operator signal for adjusting the sensitivity value and means for limiting the amount of adjustment to the sensitivity value.

23. The door sensor and door system of claim 21 wherein said first microprocessor means defines a motion zone and a presence zone for said approach zone, said motion zone being located at an extreme frontal portion of said approach zone.

* * * * *